United States Patent
Adomaitis et al.

(10) Patent No.: US 8,570,701 B2
(45) Date of Patent: Oct. 29, 2013

(54) RACKMOUNT I/O SIGNAL PROTECTOR ASSEMBLY FOR SURGE PROTECTION

(75) Inventors: Matthew Adomaitis, Aurora, IL (US); Richard J. Urban, Prospect Heights, IL (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 13/252,384

(22) Filed: Oct. 4, 2011

(65) Prior Publication Data
US 2012/0262832 A1 Oct. 18, 2012

Related U.S. Application Data

(60) Provisional application No. 61/389,801, filed on Oct. 5, 2010.

(51) Int. Cl.
| | |
|---|---|
| H01C 7/12 | (2006.01) |
| H02H 1/00 | (2006.01) |
| H02H 1/04 | (2006.01) |
| H02H 3/22 | (2006.01) |
| H02H 9/06 | (2006.01) |

(52) U.S. Cl.
USPC .......................................................... 361/119

(58) Field of Classification Search
USPC ......................................................... 361/119
See application file for complete search history.

(56) References Cited

U.S. PATENT DOCUMENTS

| | | | | |
|---|---|---|---|---|
| 6,188,557 | B1* | 2/2001 | Chaudhry | 361/111 |
| 7,497,737 | B2 | 3/2009 | Mikolajczak et al. | |
| 7,561,400 | B2* | 7/2009 | Masghati et al. | 361/119 |
| 2005/0099755 | A1 | 5/2005 | Martin et al. | |
| 2010/0149709 | A1* | 6/2010 | Straka et al. | 361/91.1 |

FOREIGN PATENT DOCUMENTS

| | | |
|---|---|---|
| EP | 1 465 314 B1 | 10/2004 |
| EP | 2 234 221 A1 | 9/2010 |

OTHER PUBLICATIONS

Soo Man (Sweetman) Kim, Transient Voltage Supressors (TVS) for Automotive Electronic Protection, Vishay General Semiconductor, Application Note, Document Number: 88490, revision: Aug. 9, 2010.

* cited by examiner

*Primary Examiner* — Dharti Patel
(74) *Attorney, Agent, or Firm* — Davis Chin; Christopher Rauch

(57) ABSTRACT

A rackmount I/O signal protector assembly for protecting telecommunications related equipment and other associated sensitive electrical components from transient voltage and current surges includes a housing enclosure, a printed circuit board disposed within the housing enclosure, and a surge protector network mounted on the printed circuit board and interconnected between an unprotected side and a protected side. The surge protector network includes gigabit surge protector circuitry formed of a plurality of voltage suppressor devices, current-limiting devices, diodes, and clamping devices. Input side connector devices are coupled to the unprotected side for connecting to incoming telecommunication lines. Output side connector devices are coupled to the protected side for connecting to customers' electrical equipment to be protected.

11 Claims, 9 Drawing Sheets

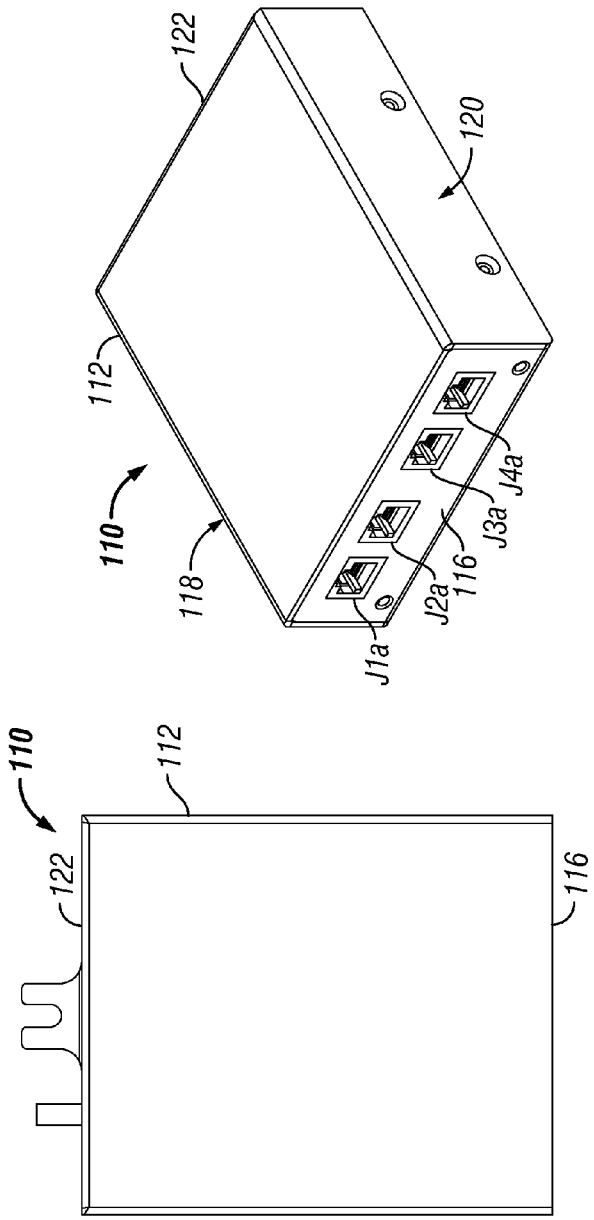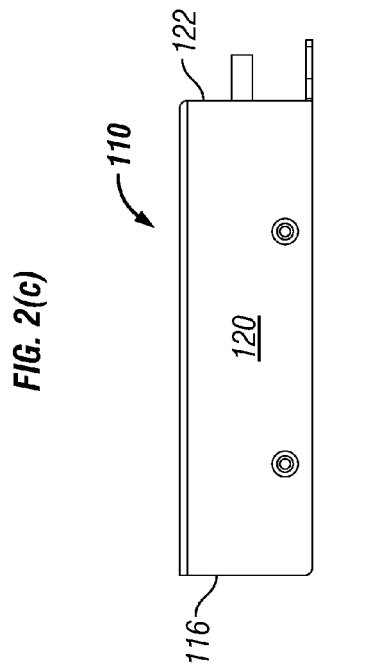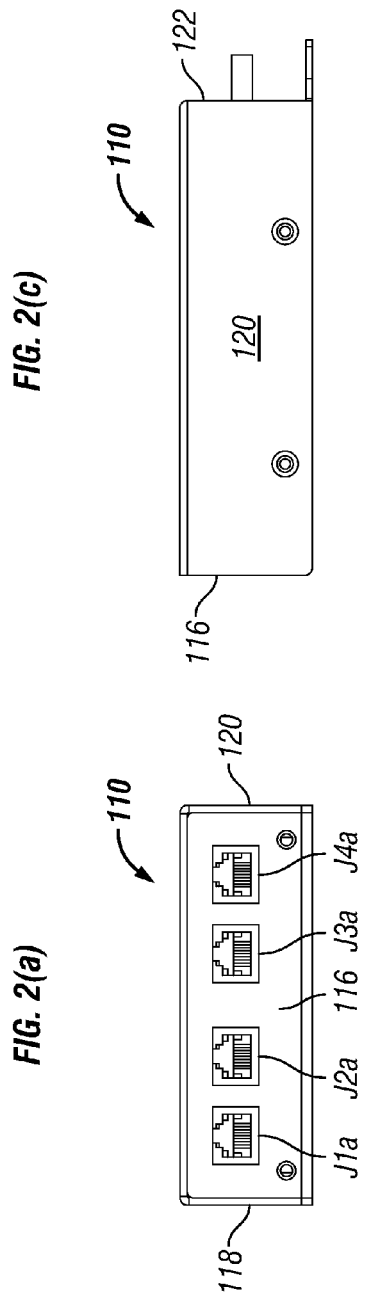

RACKMOUNT I/O SIGNAL PROTECTOR ASSEMBLY FOR SURGE PROTECTION

CROSS-REFERENCE TO RELATED APPLICATIONS

This application is a non-provisional application which claims the benefits of provisional application Ser. No. 61/389,801 filed on Oct. 5, 2010.

BACKGROUND OF THE INVENTION

1. Technical Field

This invention relates generally to surge protection devices for protecting telecommunications related equipment and associated sensitive electrical components from transient voltage and/or current surges.

2. Prior Art

As is generally well known to those skilled in the telecommunications industry, modern telecommunications related equipment is susceptible to transient surges such as those caused by lightning strikes and other voltage/current surges occurring on the incoming power lines. During the occurrence of the lightning strikes or the voltage/current surges on the incoming power lines in a power distribution network provided by electric utility companies, the power lines may become crossed-over or applied directly to the incoming telecommunication lines carrying voice signals, data signals and the like to a users' or consumers' equipment. The voice/data signals may be used for transmitting and/or receiving signals to and from various types of office equipment, such as telephone sets, computers, facsimile machines, photocopiers, alarm devices, modems, or high-speed interface circuit devices (T-1 line, DSL network, Ethernet network, 10/100/1000 Base-T interface, etc.).

Accordingly, various types of surge protector circuits are known in the prior art which have been provided for connection to the incoming telecommunication or data lines so as to be normally non-operative but are rendered active when a voltage/current surge exceeds a predetermined limit for protecting the sensitive equipment. In the typical telecommunication network, the incoming telecommunication lines carrying the voice/data signals are fed to a telecommunication cabinet (not shown) located such as in a cell phone tower site for separating these incoming voice/data lines for interconnection to the different kinds of consumers' sensitive equipment. While there are known in the prior art of voice/data line protection devices for protecting telecommunication related equipment from transient voltage/current surges, these surge protection devices however were unable to provide over-voltage and over-current transient protection and yet maintain 1 gigabit network data rates.

Therefore, it would be desirable to provide a rackmount I/O signal protector assembly for protecting telecommunication related equipment and associated sensitive electrical components from transient voltage/current surges and also maintains 1 gigabit network connectivity. The present rackmount I/O signal protector assembly includes a unique 1 gigabit surge protector circuitry and has particular application in being used for interconnection between the incoming telecommunication lines carrying the voice/data signals and the different kinds of consumers' equipment.

BRIEF SUMMARY OF THE INVENTION

Accordingly, it is a general object of the present invention to provide a rackmount I/O signal protector assembly for protecting telecommunications related equipment and associated sensitive electrical components from transient voltage and/or current surges which is relatively simple and economical to manufacture and assemble.

It is an object of the present invention to provide a rackmount I/O signal protector assembly for protecting telecommunications related equipment and associated sensitive electrical components from transient voltage and/or current surges which includes a specific rack enclosure housing design which is of a one-half rack height in size so as to be suitable for receiving a unique 1 gigabit surge protector circuitry therein and for facilitating securement into a footprint of a conventional telecommunication rack cabinet.

It is another object of the present invention to provide a rackmount I/O signal protector assembly for protecting telecommunications related equipment and associated sensitive electrical components from transient voltage and/or current surges which is characterized by a design wherein the conductive traces for the transmit and receive data pairs are laid out on a printed circuit board so as to be separated a predetermined distance for preventing network cross-talk.

It is still another object of the present invention to provide rackmount I/O signal protector assembly for protecting telecommunications related equipment and associated sensitive electrical components from transient voltage and/or current surges which includes a printed circuit board for mounting a surge protector network formed of a gigabit surge protector circuitry having a plurality of voltage suppressor devices, current-limiting devices, diodes, and clamping devices.

In a preferred embodiment of the present invention, there is provided a rackmount I/O signal protector assembly for protecting telecommunications related equipment and other associated sensitive electrical components from transient voltage and current surges includes a housing enclosure, a printed circuit board disposed within the housing enclosure, and a surge protector network mounted on the printed circuit board and interconnected between an unprotected side and a protected side.

The surge protector network includes gigabit surge protector circuitry formed of a plurality of voltage suppressor devices, current-limiting devices, diodes, and clamping devices. Input side connector devices are coupled to the unprotected side for connecting to incoming telecommunication lines. Output side connector devices are coupled to the protected side for connecting to customers' electrical equipment to be protected.

BRIEF DESCRIPTION OF THE SEVERAL VIEWS OF THE DRAWING

These and other objects and advantages of the present invention will become more fully apparent from the following detailed description when read in conjunction with the accompanying drawings with like reference numerals indicating corresponding parts throughout, wherein:

FIGS. 2(a)-2(d) are various views of a second embodiment of an I/O protector assembly, constructed in accordance with the principles of the present invention;

DETAILED DESCRIPTION OF THE INVENTION

Figure 1A:
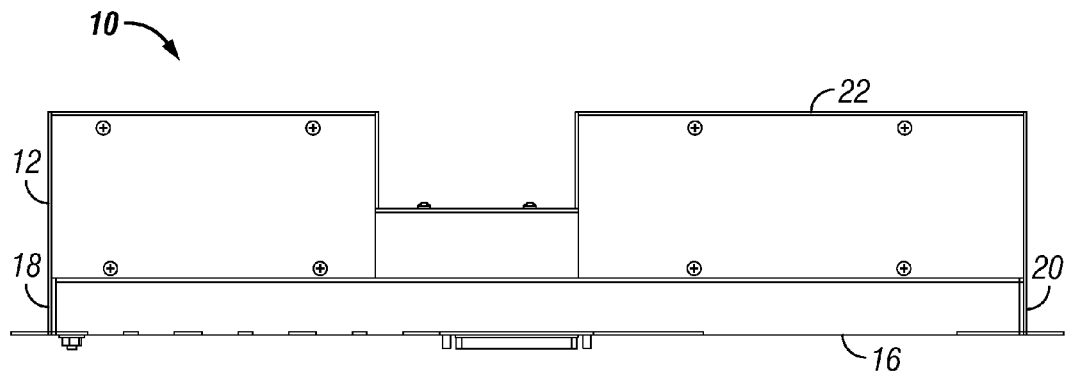
FIGS. 1(a)-1(c) are various views of a rackmount I/O protector assembly, constructed in accordance with the principles of the present invention.

It is to be distinctly understood at the outset that the present invention shown in the drawings and described in detail in conjunction with the preferred embodiments is not intended to serve as a limitation upon the scope or teachings thereof, but is to be considered merely an exemplification of the principles of the present invention.

Figure 1B:
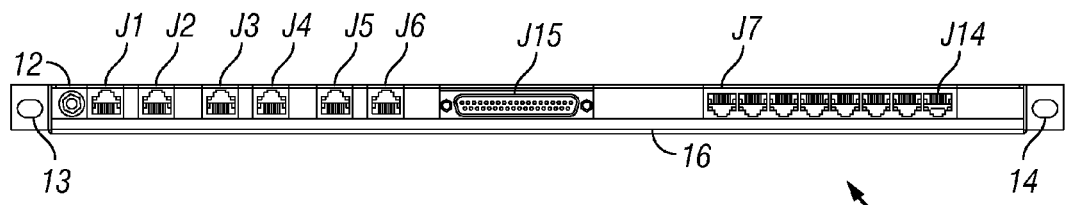
Figure 1C:
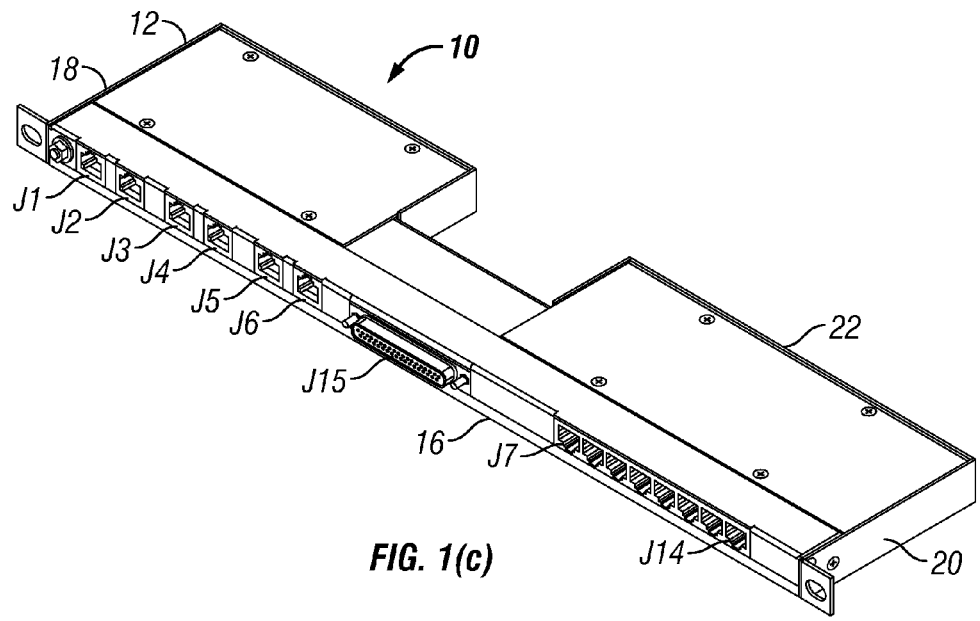
Figure 3A:
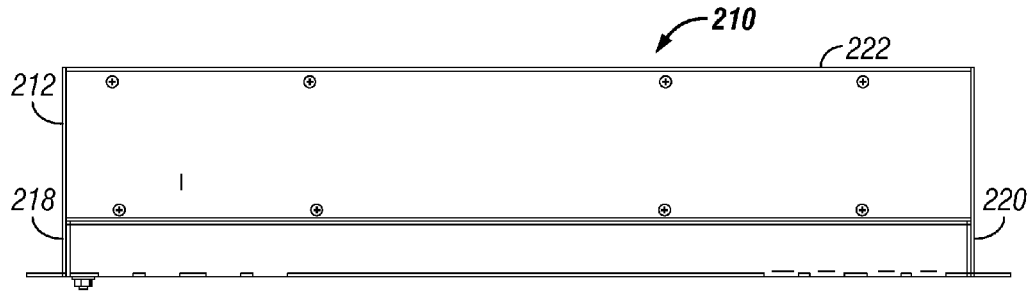
FIGS. 3(a)-3(e) are various views of a third embodiment of a rackmount I/O protector assembly, constructed in accordance with the principles of the present invention.
Figure 3B:
Figure 3C:
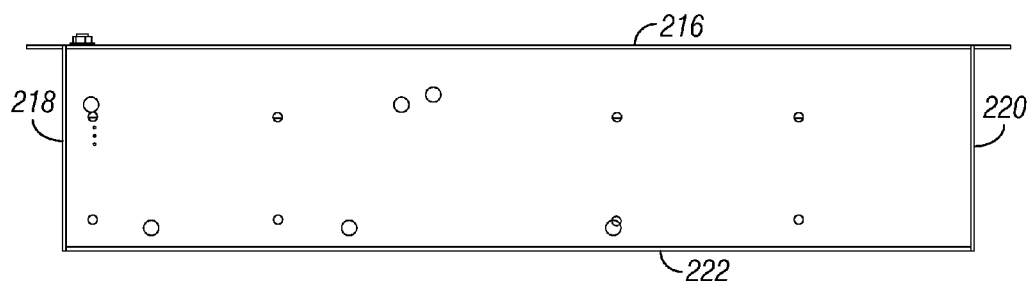
Figure 3D:
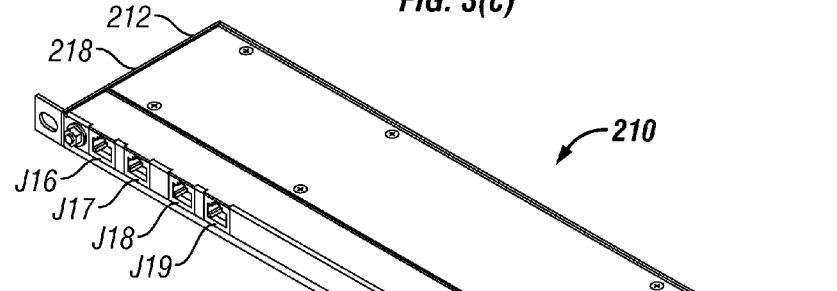
Figure 3E:
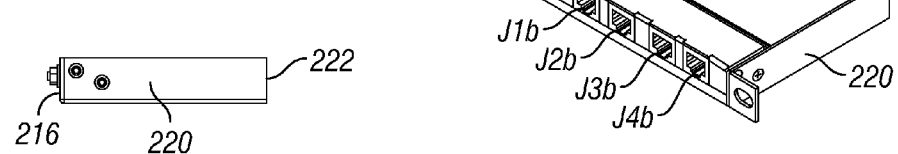
Figure 4A:
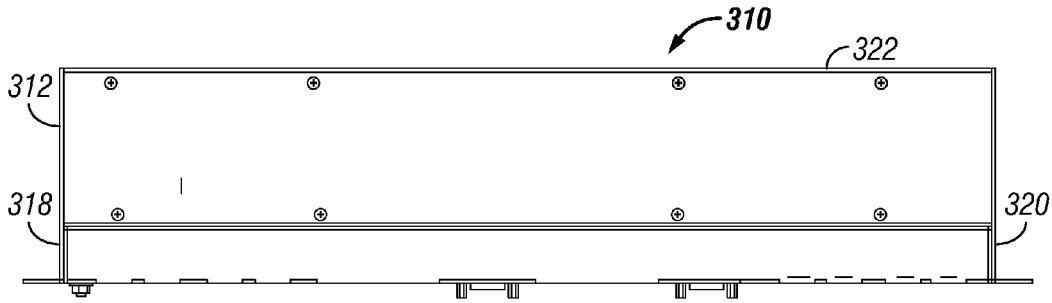
FIGS. 4(a)-4(e) are various views of a fourth embodiment of a rackmount I/O protector assembly, constructed in accordance with the principles of the present invention.
Figure 4B:
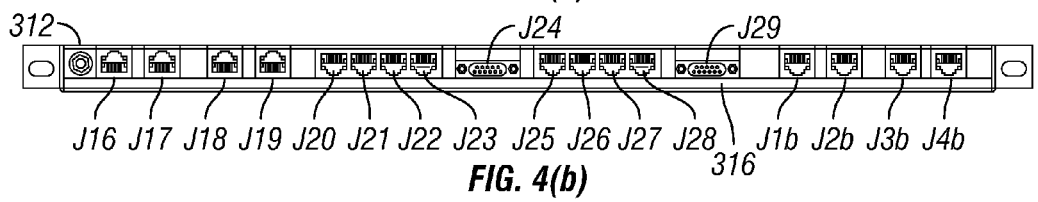
Figure 4C:
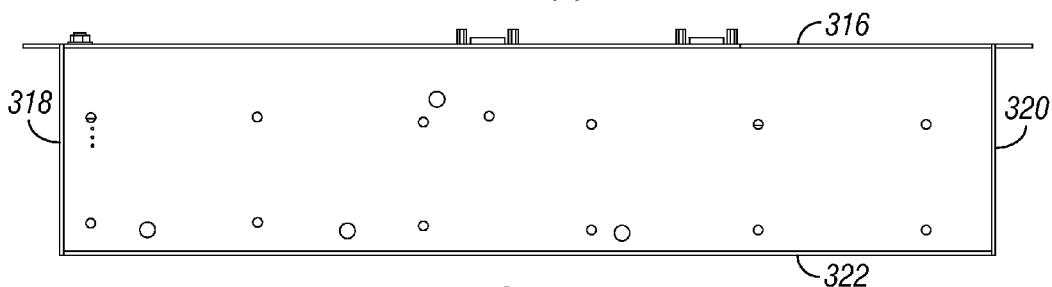
Figure 4D:
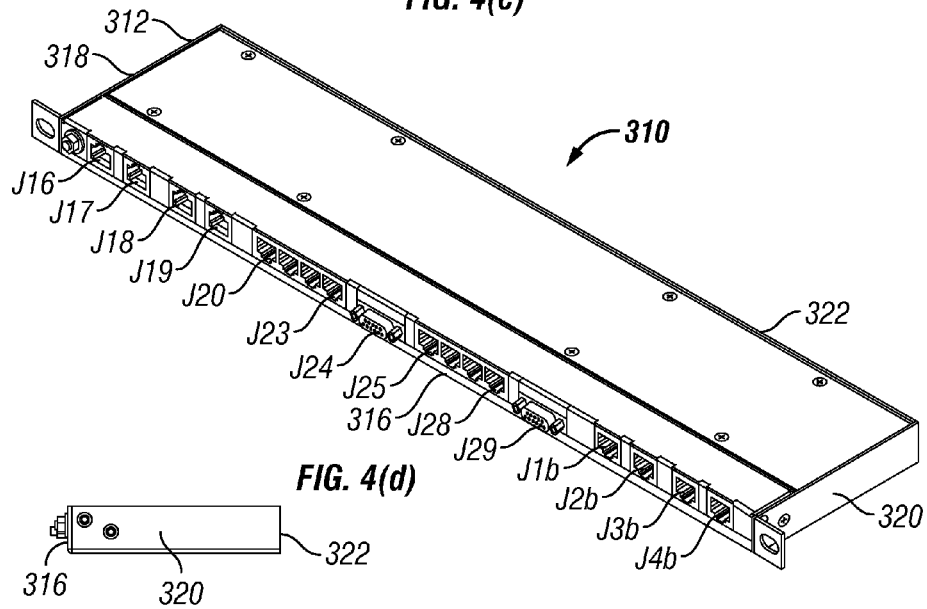
Figure 4E:

Referring now in detail to the various views of the drawings and in particular to FIGS. 1(a) through 1(c), there is illustrated a rackmount I/O signal protector assembly 10 which is constructed in accordance with the principles of the present invention. It suitably designed to fit into the standard footprint of a cabinet located in a cell phone tower site and being in common use in the telecommunications industry. The rackmount I/O signal protector assembly 10 has particular applications for use as a network interface for interconnection between the incoming telecommunication lines carrying the voice/data signals and the different kinds of consumers' sensitive electrical equipment so as to protect the same from damage caused by transient voltage and/or current surges.

The rackmount I/O signal protector assembly 10 includes a substantially flat, rectangularly-shaped housing enclosure 12 which has a one-half height design so as to mountable into a standard telecommunication rack cabinet (not shown) by means of oppositely disposed side mounting apertures 13 and 14. The housing enclosure 12 is preferably made of a suitable metallic material, such as sheet metal and the like and accommodates a number of different primary/secondary protector networks in a very limited amount of space area.

The housing enclosure 12 further includes a front wall member 16, opposed side wall members 18 and 20, and a rear wall member 22. A plurality of gigabit input or exposed side connector devices J1, J3, and J5 are mounted in the front wall member 16 adjacent to the left end of the housing enclosure 12 and are adapted to receive various incoming telecommunication lines carrying the different input voice or data signals. A plurality of gigabit output or protected side connector devices J2, J4 and J6 are also mounted in the front wall member 16 adjacent to the left end of the housing enclosure 12 and are adapted for connection to various sensitive consumers' equipment to be protected (i.e., telephone sets, computers, fax machines, etc.). It will be noted that each of the output side connector devices J2, J4 and J6 are mounted adjacent to the corresponding input side connector devices J1, J3 and J5, respectively.

As is illustrated in this particular embodiment, each of the input side connector devices J1, J3 and J5 and each of the output side connector devices J2, J4 and J6 is a standardized modular RJ-45 jack which is commercially available. However, it should be clearly understood that other types of connector devices for either the input side or output side may be used. Each of the modular RJ-45 jacks is adapted to receive a standardized modular plug connectible to either the incoming telecommunication lines or the consumers' electrical equipment. The input and output connector devices provide for quick and easy mechanical interconnections of the present rackmount I/O signal protector assembly between the incoming telecommunication lines and the consumers' electrical equipment.

A plurality of T1/E1 input or exposed side connector devices J7 through J14 are also mounted in the front wall member adjacent to the right end of the housing enclosure 12 and are adapted to receive the various incoming telecommunication lines carrying the different input voice or data signals. Again, each of the T1/E1 input side connector devices J7-J14 is a standardized modular RJ-45 jack. In the middle portion of the front wall member 16, there is provided a 37-pin T1/E1 output or protected side connector device J15 and is adapted for connection to the various sensitive consumers' equipment to be protected. The 37-pin connector device is similar to the type 1-380758-0 manufactured by Tyco.

Figure 5:
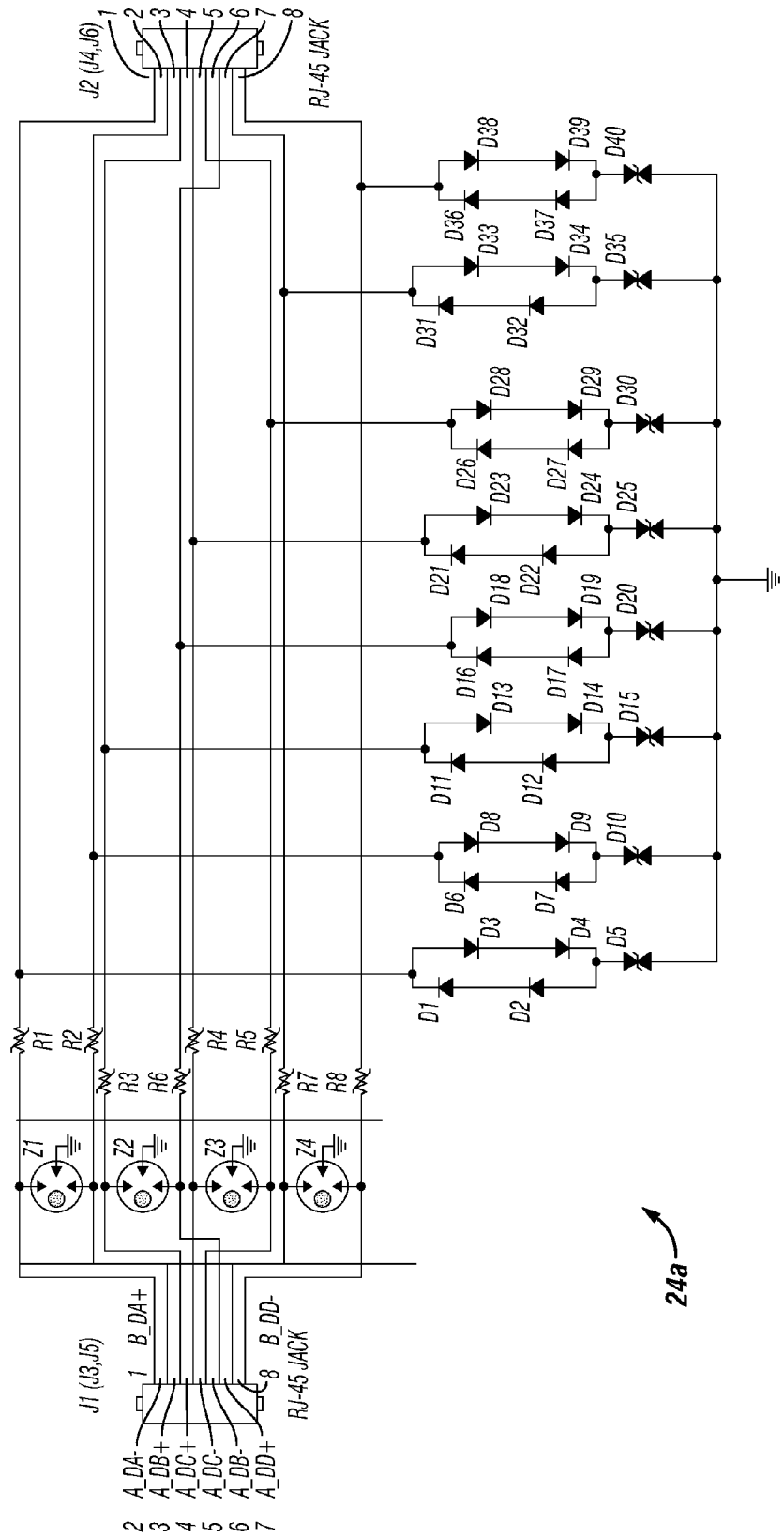
FIG. 5 is a schematic circuit diagram of a first one of the surge protector networks for use in FIGS. 1, 3 and 4.

The housing enclosure 12 is adapted to receive a printed circuit board which is used to mount the different primary/secondary protector networks. A schematic circuit diagram of a first one of the surge protector networks defined by a unique gigabit surge protector circuitry 24a of the present invention interconnected between the input side connector device J1 and the output side connector device J2 is illustrated in FIG. 5 of the drawings. Similarly, a second one of the gigabit surge protector circuitry 24a is also interconnected between the input side connector device J3 and the output side connector device J4. In addition, a third one of the gigabit surge protector circuitry 24a is also interconnected between the input side connector device J5 and the output side connector device J6.

As can be seen from FIG. 5, the gigabit surge protector circuitry 24a is comprised of a plurality of plasma gas tube arresters Z1-Z4; a plurality of series current-limiting positive temperature coefficient (PTC) resistors R1-R8; a plurality of low capacitance diodes D1-D4, D6-D9, D11-D14, D16-D19, D21-D24, D26-D29, D31-D34, and D36-D39; and a plurality of Transient Voltage Semiconductor (TVS) clamping devices D5, D10, D15, D20, D25, D30, D35, and D40. The input side of the protector circuitry 24a is connected between two wires of the incoming telecommunication lines applied across the respective input pins 1,2; 3,6; 4,5; and 7,8 of the RJ-45 jack J1 (J3 or J5) defining an unprotected side. The output side of the protector circuitry 24a is connected between two wires of a customers' electrical equipment to be protected applied across the respective output pins 1,2; 3,6; 4,5; and 7,8 of the RJ-45 jack J2 (J4 or J6) defining a protected side.

In the preferred embodiment, the plasma gas tube arresters Z1-Z4 are similar to the type 3YVJ-260J1F2 manufactured by Sankosha and the TVS clamping devices D5, D10, D15, D20, D25, D30, D35, and D40 are similar to the type 1.5KExx series device manufactured by Vishay. Further, the PTC resistors R1-R8 are similar to the type TR600-RA-B-0.5-0.13 manufactured by Raychem and the low capacitance diodes D1-D4, D6-D9, D11-D14, D16-D19, D21-D24, D26-D29, D31-D34, and D36-D39 are similar to the type Bav 103 manufactured by Vishay.

Figure 6:
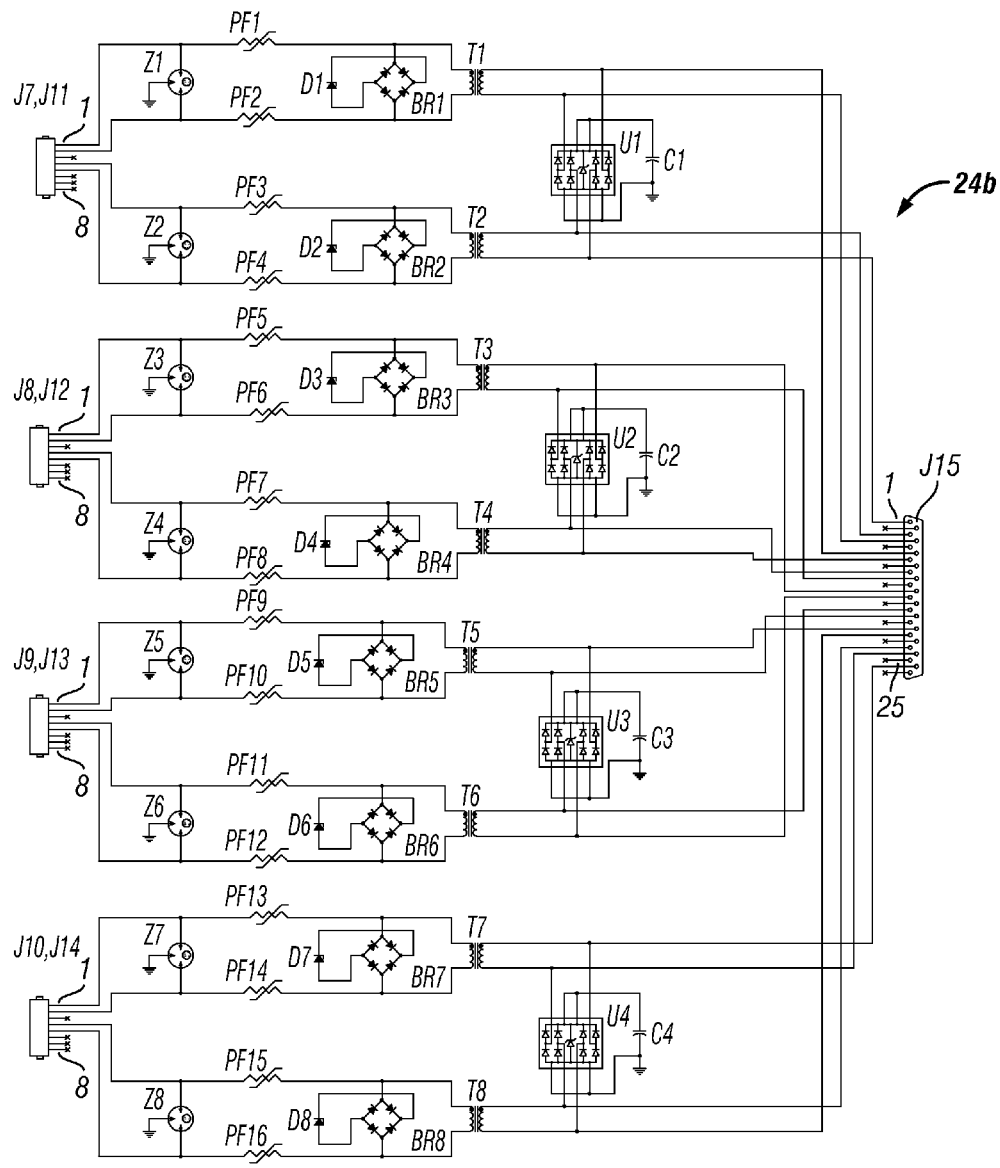
FIG. 6 is a schematic circuit diagram of a second one of the surge protector networks for use in FIGS. 1 and 4.

A schematic circuit diagram of a second one of the protector networks defined by the surge protector circuitry 24b interconnected the input side connector devices J7-J14 and the output side connector device J15 is illustrated in FIG. 6 of the drawings.

As can be seen from FIG. 6, the surge protector circuitry 24b is comprised of a plurality of plasma gas tube arresters Z1-Z8, a plurality of series current-limiting positive temperature coefficient (PTC) resistors PF1-PF16, a plurality of bridge rectifiers BR1-BR8, a plurality of Zener diodes Z1-Z8, a plurality of transformer T1-T8 each having a primary winding and a secondary winding, a plurality of diode networks U1-U4, and a plurality of capacitor C1-C4. The input side of the protector circuitry 24b is connectable between the wires of the incoming telecommunication lines applied to the input pins of the RJ-45 jacks J7-J10 defining an unprotected side. The output side of the surge protector circuitry 24b is connectable between the wires of a customers' electrical equipment to be protected applied to certain ones of the output pins of the 37-pin connector device J15 defining a protected side. A second one of the surge protector circuitry 24b is similarly connected between the input pins of the RJ-45 jacks J11-J14 and certain other output pins of the 37-pin connector device J15.

In the preferred embodiment, the plasma gas tube arresters Z1-Z8 are similar to the type 3YVJ-260J1F2 and the PTC resistors PF1-PF16 are similar to TR600-160-RA-B-0.5-0.13. Further, the bridge rectifiers BR1-BR8 are similar to DF1510 and the diode networks U1-U4 is similar to SRDA3.3-4.

In FIGS. 2(a)-2(d), there is illustrated a second embodiment of an I/O signal protector assembly 110 which is constructed in accordance with the principles of the present invention. The rackmount I/O signal protector assembly 110 includes a substantially rectangularly-shaped housing enclosure 112 and has a front wall member 116, opposed side wall members 118 and 120, and a rear wall member 122. A pair of gigabit input or exposed side connector devices J1a and J3a are mounted in the front wall member 116 of the housing enclosure 112 and are adapted to receive various incoming telecommunication lines carrying the different input voice or data signals.

A pair of gigabit output or protected side connector devices J2a and J4a are also mounted in the front wall member 116 of the housing enclosure 112 and are adapted for connection to various sensitive consumers' equipment to be protected. It will be noted again that each of the output side connector devices J2a and J4a are mounted adjacent to the corresponding input side connector devices J1a and J3a, respectively. As is illustrated in this particular embodiment, each of the input side connector devices J1a and J3a and each of the output side connector devices J2a and J4a is again a standardized modular RJ-45 jack.

Figure 7:
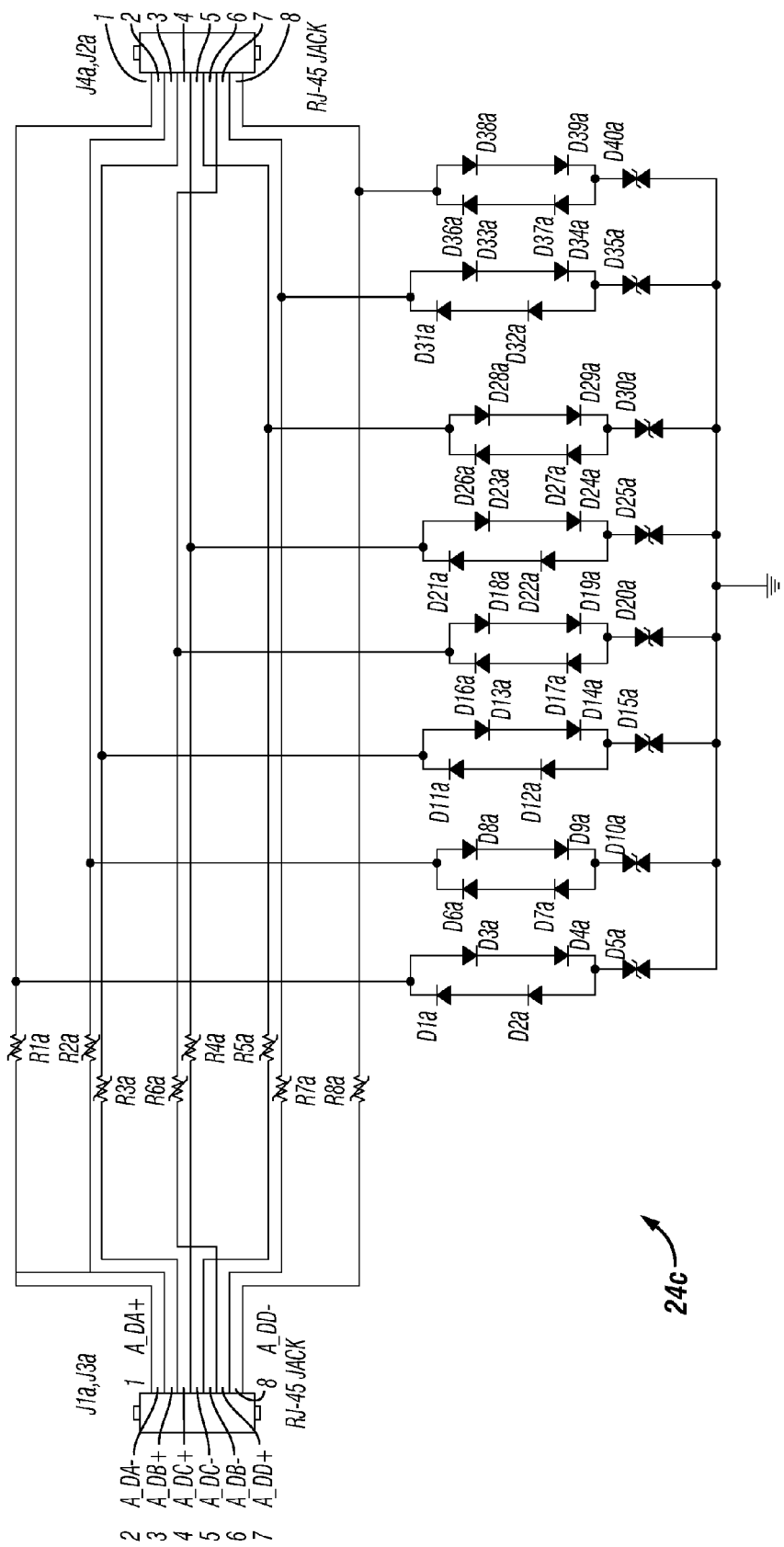
FIG. 7 is a schematic circuit diagram of the surge protector network for use in FIG. 2.

The housing enclosure 112 is adapted to receive a printed circuit board which is used to mount a secondary protector network. A schematic circuit diagram of a third one of the protector networks defined by a unique gigabit surge protector circuitry 24c of the present invention interconnected between the input side connector device J1a and the output side connector device J2a is illustrated in FIG. 7 of the drawings. Similarly, a second one of the gigabit surge protector circuitry 24c is also interconnected between the input side connector device J3a and the output side connector device J4a.

As can be seen from FIG. 7, the gigabit surge protector circuitry 24c is substantially identical to the surge protector circuitry 24a of FIG. 5, except that the plasma gas tube arresters have been eliminated. In particular, the gigabit surge protector circuitry 24c is comprised of a plurality of series current-limiting positive temperature coefficient (PTC) resistors R1a-R8a; a plurality of low capacitance diodes D1a-D4a, D6a-D9a, D11a-D14a, D16a-D19a, D21a-D24a, D26a-D29a, D31a-D34a, and D36a-D39a; and a plurality of Transient Voltage Semiconductor (TVS) clamping devices D5a, D10a, D15a, D20a, D25a, D30a, D35a, and D40a. The input side of the protector circuitry 24c is connected between two wires of the incoming telecommunication lines applied across the respective input pins 1,2; 3,6; 4,5; and 7,8 of the RJ-45 jack J1a (J3a) defining an unprotected side. The output side of the protector circuitry 24c is connected between two wires of a customers' electrical equipment to be protected applied across the respective output pins 1,2; 3,6; 4,5; and 7,8 of the RJ-45 jack J2a (J4a) defining a protected side.

In FIGS. 3(a)-3(e), there is illustrated a third embodiment of a rackmount I/O signal protector assembly 210 which is constructed in accordance with the principles of the present invention. The rackmount I/O signal protector assembly 210 is substantially identical in its structure to the protector assembly 10. The rackmount I/O signal protector assembly 210 includes a substantially rectangularly-shaped housing enclosure 212 and has a front wall member 216, opposed side wall members 218 and 220, and a rear wall member 222. A pair of gigabit input or exposed side connector devices J1b and J3b are mounted in the front wall member 216 adjacent to the right end of the housing enclosure 212 and are adapted to receive various incoming telecommunication lines carrying the different input voice or data signals. A pair of gigabit output or protected side connector devices J2b and J4b are also mounted in the front wall member 216 adjacent to the right end of the housing enclosure 212 and are adapted for connection to various sensitive consumers' equipment to be protected.

The housing enclosure 212 is adapted to receive a printed circuit board which is used to mount the same unique gigabit surge protector circuitry 24a of the present invention. The surge protector circuitry 24a is interconnected between the input side connector device J1b and the output side connector device J2b. Similarly, a second one of the gigabit surge protector circuitry 24a is also interconnected between the input side connector device J3b and the output side connector device J4b.

In addition, a pair of alarm input or exposed side connector devices J16 and J18 are also mounted in the front wall member 216 adjacent to the left end of the housing enclosure 212 and are adapted to receive alarm signals. A pair of alarm output or protected side connector devices J17 and J19 are also mounted in the front wall member 216 adjacent to the left end of the housing enclosure 212 and are adapted for connection to the customers' alarm monitoring equipment.

Figure 8:
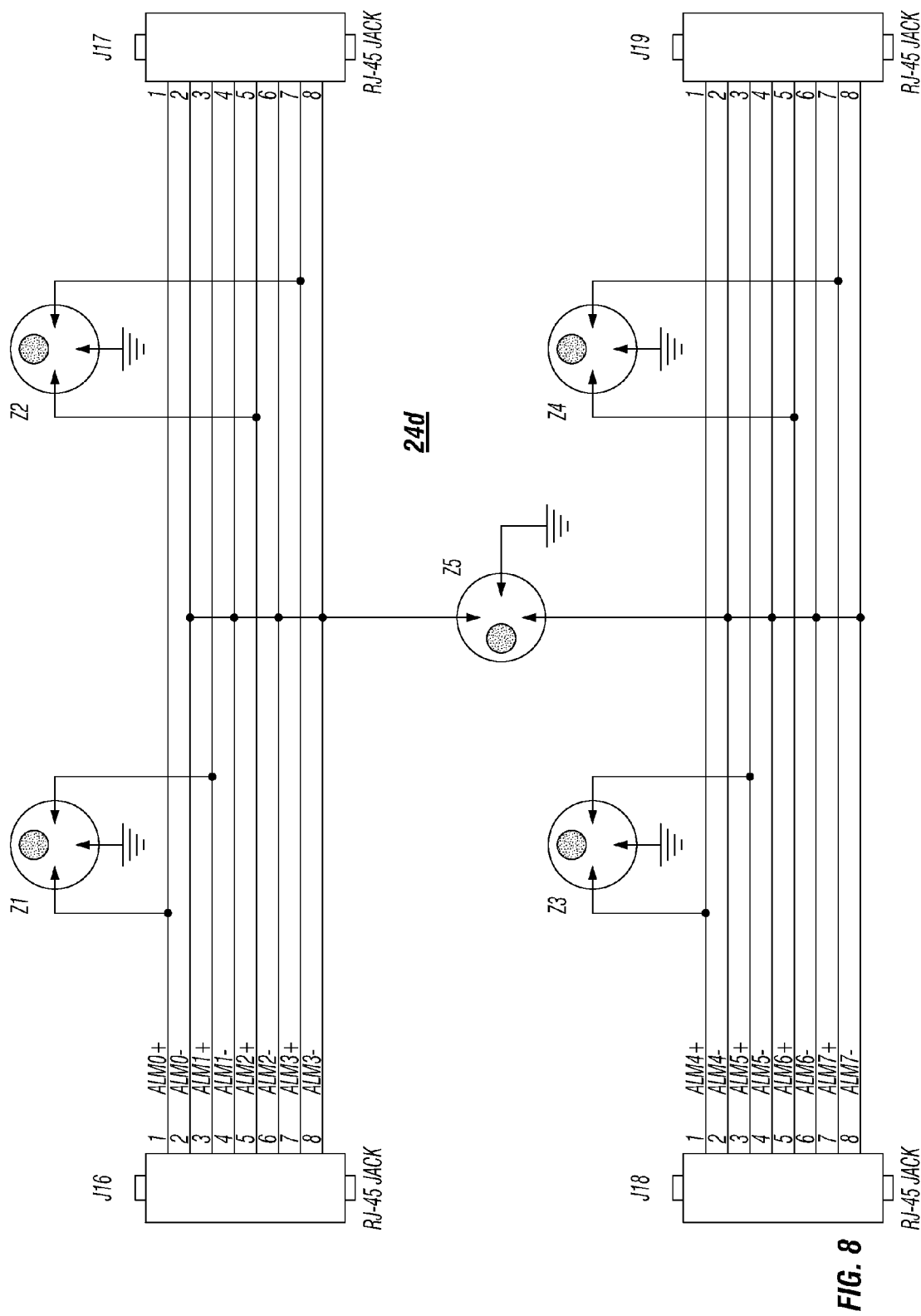
FIG. 8 is a schematic circuit diagram of the surge protector network for use in FIGS. 3 and 4.

A schematic circuit diagram of a fourth one of the protector networks defined by an alarm surge protector circuitry 24d of the present invention interconnected between the input side connector devices J16, J18 and the output side connector devices J17, J19 is illustrated in FIG. 8 of the drawings. The protector circuitry 24d is comprised of a plurality of plasma gas tube arresters Z1-Z5.

In FIGS. 4(a)-4(e), there is illustrated a fourth embodiment of a rackmount I/O signal protector assembly 310 which is constructed in accordance with the principles of the present invention. The rackmount I/O signal protector assembly 310 is substantially identical in its structure to the protector assembly 210. The rackmount I/O signal protector assembly 310 includes a substantially rectangularly-shaped housing enclosure 312 and has a front wall member 316, opposed side wall members 318 and 320, and a rear wall member 322.

In the front wall member 316 adjacent to the right end of the housing enclosure 312, there is mounted the same gigabit input/output side connector devices J1b, J2b, J3b and J4b as shown in FIG. 3(a)-3(e). Also, in the front wall member 316 adjacent to the left end of the housing enclosure 312, there is mounted the same alarm input/output side connector devices J16 through J19 as shown in FIG. 3(a)-3(e).

In addition, in the middle section of the front wall member 316 there are a first one of T1/E1 input side connector devices J20-J23, a first T1/E1 output side connector device J24, a second one of T1/E1 input side connector devices J25-J28, and a second T1/E1 output side connector device J29. A first one of the surge protector circuitry 24b is interconnected between the connector devices J20-J23 and J24. A second one of the surge protector circuitry 24b is interconnected between the connector devices J25-J28 and J29. The connector devices J20-J23 and J25-J28 are standardized modular RJ-45 jacks. The connector devices J25 and J29 are 25-pin micro-connector devices similar to type MDSM-25PE-Z10-VR17 manufactured by ITT.

Figure 9:
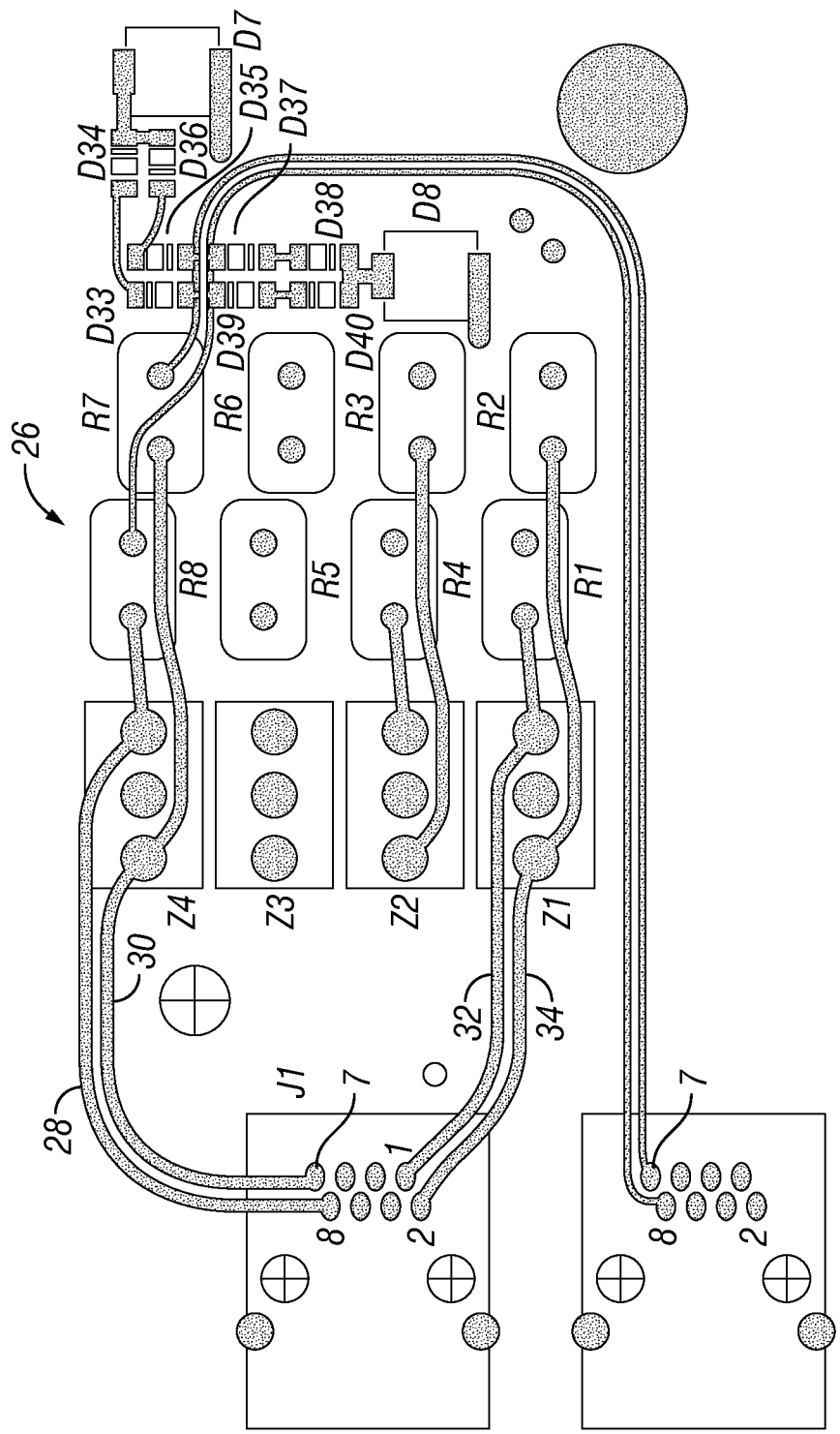
FIG. 9 is top plan view of a portion of a multi-layered printed circuit board with the electrical components removed, illustrating the layout of the adjacent pairs of conductive traces.

In FIG. 9 of the drawings, there is depicted a top plan view of a portion of a multi-layered printed circuit board 26 with the electrical components removed so to illustrate the layout of the adjacent pairs of conductive traces. The printed circuit board 26 is used to mount the various electrical components of the surge protector circuitry 24a, 24b, 24c and 24d. As can be seen, in order to achieve a low capacitance/low crosstalk as well as low return loss and attenuation the transmit and receive data pairs are laid out on the printed circuit board 26 in a spaced apart relationship to prevent network cross-talk.

In particular, a first pair of conductive traces 28, 30 for the first transmit and receive data pair are positioned to be as far as possible from a second pair of conductive traces 32, 34 for the second transmit and receive data pair in order to prevent network cross-talk. Further, it will be noted that the transmit/receive conductive traces 28, 32 has been maintained to be in a parallel relationship with the respective transmit/receive conductive traces 30, 34 and are made to be relatively straight in order to provide low impedance and low insertion loss.

From the foregoing detailed description, it can be seen that the present invention provides a rackmount I/O signal protector assembly for protecting copper wire networks from over-voltage transients, as well as over-current transients ("sneak current" surges), but yet maintains 1 Gigabit network connectivity. The present protector assembly protects against surge levels as described in UL 497 and UL 497A, installed in accordance with Article 800 of the National Electric Code (NEC). The purpose of this protector assembly is to help reduce the risk of fire, electrical shock, damage to equipment or injury as deployed to high-speed data systems.

The unique features of this protector assembly are achieved through the use of low capacitance, plasma gas tube arresters and high speed, low capacitance diodes used in "steering" the transient over-voltages to the Transient Voltage Semiconductor (TVS) voltage clamping devices while limiting destructive current with series Positive Temperature Coefficient (PTC) resistors. The present protector assembly design also utilizes high-speed network rated connector devices for data network compatibility.

Further, the plasma gas tube arresters provide the high energy capability to meet the UL 497 surge limits. This protector assembly also adds additional data line protection in the form of current-limiting, UL rated PTC resistors and meets the surge level protection requirements of UL 497A. This protector assembly design protects for over-voltage and over-current at a 1-Gigabit data rate. There is also provided within the rack housing enclosure is a primary (UL 497) rated surge protector for data alarm signals and a primary/secondary (UL 497, UL 497A) rated protector for T1/E1 telecom circuits.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A rackmount I/O signal protector assembly for protecting telecommunications related equipment and other associated sensitive electrical components from transient voltage and current surges, comprising:

a substantially flat, rectangularly-shaped housing enclosure;

said housing enclosure being formed of a one-half rack design and being adapted to fit into the footprint of a standard telecommunication rack cabinet;

said housing enclosure having a front wall member, opposed side wall members, and a rear wall member;

a printed circuit board being disposed within said housing enclosure;

said printed circuit board including a plurality of paired transmit and receive conductive traces, each paired transmit and receive conductive traces being spaced apart a predetermined distance from each other so to reduce cross-talk therebetween;

each of the transmit conductive traces and each of the receive conductive traces within each pair being disposed in a parallel relationship to each other and being made relatively straight so as to provide low impedance and low insertion loss;

a plurality of first surge protector networks being mounted on said printed circuit board and interconnected between an unprotected side and a protected side;

each of said surge protector networks including gigabit surge protector circuitry formed of a plurality of voltage suppressor devices, current-limiting devices, diodes, and clamping devices;

input side connector means coupled to said unprotected side for connecting to incoming telecommunication lines;

output side connector means coupled to said protected side for connecting to customers' electrical equipment to be protected;

said input connector means including a plurality of gigabit input side connector devices being mounted in said front wall member adjacent to the left end of said housing enclosure and being adapted to receive various incoming telecommunication lines;

said output connector means further including a plurality of gigabit output side connector devices being also mounted in said front wall member adjacent to the left end of said housing enclosure and being adapted for connection to various sensitive consumers' equipment to be protected;

each one of said plurality of gigabit output side connector devices being mounted adjacent to a corresponding one of said gigabit input side connector devices;

said input connector devices further including a plurality of T1/E1 input side connector devices being also mounted in said front wall member adjacent to the right end of said housing enclosure and being adapted to the various incoming telecommunication lines;

said output side connector device further including a T1/E1 output side connector device being mounted in the middle portion of said front wall member and being adapted for connection to the various sensitive consumers' equipment to be protected;

each of said gigabit surge protector circuitry being interconnected between one of said plurality of gigabit input side connector devices and a corresponding one of said plurality of gigabit output side connector devices; and a second surge protector network being interconnected between said plurality of T1/E1 input side connector devices and said T1/E1 output side connector device.

2. A rackmount I/O signal protector assembly as claimed in claim 1, wherein each of said plurality of gigabit input side connector devices includes a standardized modular RJ-45 jack.

3. A rackmount I/O signal protector assembly as claimed in claim 2, wherein each of said plurality of gigabit output side connector devices includes a standardized modular RJ-45 jack.

4. A rackmount I/O signal protector assembly as claimed in claim 1, wherein each of said plurality of voltage suppressor devices is formed of a plasma gas tube.

5. A rackmount I/O signal protector assembly as claimed in claim 4, wherein each of said plurality of current-limiting devices is formed of a positive temperature coefficient resistor.

6. A rackmount I/O signal protector assembly as claimed in claim 5, wherein each of said plurality of diodes is formed of a low capacitance diode.

7. A rackmount I/O signal protector assembly as claimed in claim 6, wherein each of said plurality of clamping devices is formed of a transient voltage semiconductor (TVS) clamping device.

8. A rackmount I/O signal protector assembly for protecting telecommunications related equipment and other associated sensitive electrical components from transient voltage and current surges, comprising:

multi-layered printed circuit board means;

surge protector means being mounted on said multi-layered printed circuit board means;

said surge protector means including gigabit surge protector circuitry formed of a plurality of voltage suppressor devices, current-limiting devices, diodes, and clamping devices;

said multi-layered printed circuit board means including a plurality of paired transmit and receive conductive traces, each paired transmit and receive conductive traces being spaced apart a predetermined distance from each other so to reduce cross-talk therebetween; and each of the transmit conductive traces and each of the receive conductive traces within each pair being disposed in a parallel relationship to each other and being made relatively straight so as to provide low impedance and low insertion loss.

9. A rackmount I/O signal protector assembly as claimed in claim 8, wherein each of said plurality of voltage suppressor devices is formed of a plasma gas tube, and wherein each of said plurality of current-limiting devices is formed of a positive temperature coefficient resistor.

10. A rackmount I/O signal protector assembly as claimed in claim 9, wherein each of said plurality of diodes is formed of a low capacitance diode, and wherein each of said plurality of clamping devices is formed of a transient voltage semiconductor (TVS) clamping device.

11. A rackmount I/O signal protector assembly as claimed in claim 8, wherein said protector assembly is formed of a one-half rack design and is adapted to fit into the footprint of a standard telecommunication rack cabinet.

* * * * *